United States Patent
Yun et al.

(10) Patent No.: US 12,038,473 B2
(45) Date of Patent: Jul. 16, 2024

(54) TEST SOCKET FOR PERFORMING A TEST ON AN ELECTRONIC DEVICE

(71) Applicant: SAMSUNG ELECTRONICS CO., LTD., Suwon-si (KR)

(72) Inventors: Kiljoong Yun, Hwaseong-si (KR); Kwangkyu Bang, Hwaseong-si (KR); Yun Chang, Hwaseong-si (KR); Jaegyu Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 17/738,272

(22) Filed: May 6, 2022

(65) Prior Publication Data

US 2023/0098635 A1 Mar. 30, 2023

(30) Foreign Application Priority Data

Sep. 28, 2021 (KR) .................. 10-2021-0127723

(51) Int. Cl.
- G01R 31/28 (2006.01)
- G01R 1/04 (2006.01)
- G01R 1/10 (2006.01)

(52) U.S. Cl.
CPC ....... G01R 31/2884 (2013.01); G01R 1/0408 (2013.01); G01R 31/2844 (2013.01); G01R 31/2863 (2013.01)

(58) Field of Classification Search
CPC . G01R 1/0466; G01R 31/2863; G01R 1/0483
See application file for complete search history.

(56) References Cited

U.S. PATENT DOCUMENTS

| | | | |
|---|---|---|---|
| 7,922,544 B2 | 4/2011 | Chung | |
| 8,864,521 B2 | 10/2014 | Atkinson et al. | |
| 2005/0017742 A1* | 1/2005 | Stutzman | G01R 1/0466 324/756.02 |
| 2005/0162152 A1* | 7/2005 | Yates | G01R 1/0441 324/756.02 |

(Continued)

FOREIGN PATENT DOCUMENTS

| | | |
|---|---|---|
| KR | 10-1326298 | 11/2013 |
| KR | 10-1447363 | 10/2014 |

(Continued)

*Primary Examiner* — Jermele M Hollington
*Assistant Examiner* — Temilade S Rhodes-Vivour
(74) *Attorney, Agent, or Firm* — F. Chau & Associates, LLC

(57) ABSTRACT

A test socket includes: a first body including a fixing portion configured to receive a sample having a plurality of test terminals; a second body facing the first body and coupled with the first body such that the second body rotates relative to the first body about a hinge pin; a test board provided on the second body and configured to test the sample, wherein the test board has a plurality of first openings provided therein; and a plurality of interface pins penetrating through the first openings, wherein each of the plurality of interface pins includes a contact pin and a spring, wherein the contact pin is provided in a first end portion of each of the plurality of interface pin and is configured to come into contact with a test terminal of the plurality of test terminals, and the spring elastically supports the contact pin.

19 Claims, 12 Drawing Sheets

(56) References Cited

U.S. PATENT DOCUMENTS

| | | | |
|---|---|---|---|
| 2006/0068614 A1* | 3/2006 | Harper | G01R 1/0466 439/70 |
| 2015/0015293 A1* | 1/2015 | Johnson | G01R 1/0466 324/756.02 |
| 2015/0234005 A1* | 8/2015 | Kim | G01R 31/2891 324/750.08 |
| 2017/0286254 A1 | 10/2017 | Menon et al. | |

FOREIGN PATENT DOCUMENTS

| | | |
|---|---|---|
| KR | 10-1794601 | 11/2017 |
| KR | 10-2191699 | 12/2020 |

* cited by examiner

FIG. 11
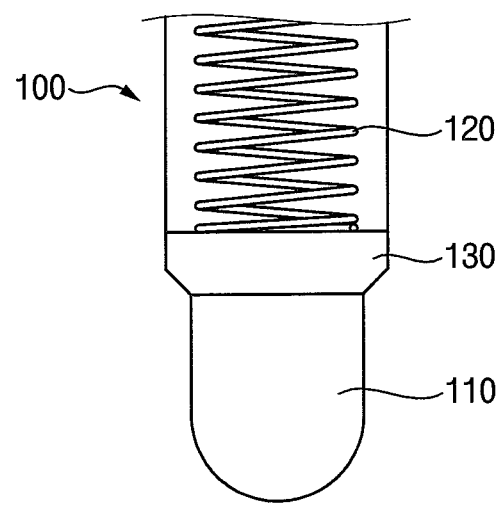
FIG. 12
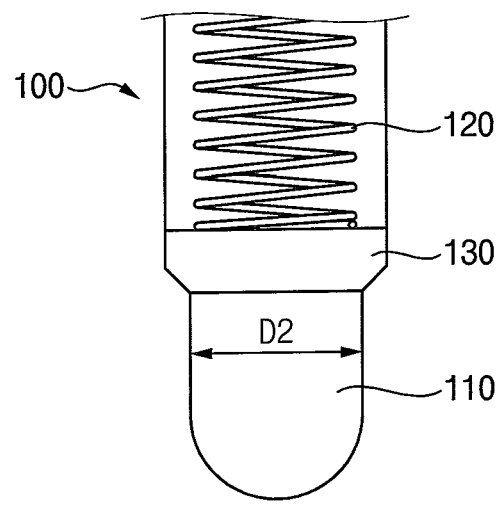
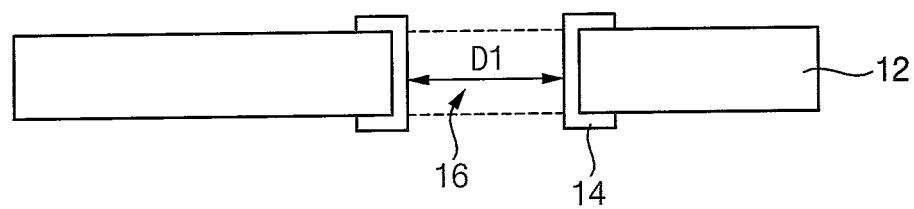

TEST SOCKET FOR PERFORMING A TEST ON AN ELECTRONIC DEVICE

CROSS-REFERENCE TO RELATED APPLICATION

This application claims priority under 35 U.S.C. § 119 to Korean Patent Application No. 10-2021-0127723 filed on Sep. 28, 2021 in the Korean Intellectual Property Office (KIPO), the disclosure of which is incorporated by reference herein in its entirety.

TECHNICAL FIELD

Exemplary embodiments of the present inventive concept relate to a test socket. More particularly, exemplary embodiments of the present inventive concept relate to a test socket for performing a test on an electronic device.

DISCUSSION OF THE RELATED ART

When an electronic device such as a solid state drive (SSD) is being manufactured, it is desirable to perform a debug test after a manufacturing process of the SSD is completed. Generally, the test is performed by inserting a pin into a via hole inspection terminal provided in the electronic device. In iterative test processes, damage to the via hole inspection terminal, which includes a conductive material, may cause contact defects with the pin during the test. Further, a short circuit may occur while inserting a plurality of the pins into a plurality of the via holes, thereby applying an impact or a force on the electronic device.

SUMMARY

According to an exemplary embodiment of the present inventive concept, a test socket includes: a first body including a fixing portion configured to receive a sample having a plurality of test terminals; a second body hiring the first body and coupled with the first body such that the second body rotates relative to the first body about a hinge pin; a test board provided on the second body and configured to test the sample, wherein the test board has a plurality of first openings provided therein; and a plurality of interface pins penetrating through the first openings, wherein each of the plurality of interface pins includes a contact pin and a spring, wherein the contact pin is provided in a first end portion of each of the plurality of interface pin and is configured to come into contact with a test terminal of the plurality of test terminals, and the spring elastically supports the contact pin.

According to an exemplary embodiment of the present inventive concept, a test socket includes: a first body including a fixing portion configured to receive a sample a plurality having of test terminals; a second body facing the first body and coupled with the first body such that the second body rotates relative to the first body about a hinge pin; a test board disposed on the second body and configured to test the sample; a plurality of interface pins provided in the test board to extend toward the first body in a preset arrangement, wherein each of the plurality of interface pins has a cylindrical body, a contact pin, and a spring, wherein the cylindrical body has an open end portion, wherein the contact pin is provided in the open end portion of the cylindrical body and comes into contact with a test terminal of the plurality test terminals, and the spring applies an elastic force to the contact pin toward the open end portion of the cylindrical body; and an elastic body configured to provide a restoring force between the first and second bodies to bring the plurality of interface pins toward the sample mounted on the fixing portion.

According to an exemplary embodiment of the present inventive concept, A test socket includes: a first body including a fixing portion configured to receive a sample having a plurality of test terminals; a second body coupled with the first body to rotate relative to the first body by a hinge pin; a test board provided on the second body and configured to test the sample, wherein the test board has a plurality of first openings provided therein; a plurality of interface pins penetrating through the first openings, wherein each of the plurality of interface pins includes a contact pin and a spring, wherein the contact pin is provided in a first end portion of each of the plurality of interface pin and is configured to come into contact with a test terminal of the plurality of test terminals, and wherein the spring elastically presses the contact pin toward the sample and is configured to absorb shock; and an elastic body configured to provide a restoring force between the first and second bodies to bring the plurality of interface pins toward the sample mounted on the fixing portion, wherein the fixing portion receives the sample at a preset position to be mounted thereon such that the contact pins of the plurality of interface pins come into contact with the plurality of test terminals when the second body rotates about the hinge pin due to the restoring force provided by the elastic body.

BRIEF DESCRIPTION OF THE DRAWINGS

The above and other features of the present inventive concept will become more apparent by describing in detail example embodiments thereof, with reference to the accompanying drawings, in which:

FIG. 11 is a cross-sectional view illustrating an end portion of an interface pin according to an exemplary embodiment of the present inventive concept.

FIGS. 12, 13, 14 and 15 are cross-sectional views illustrating operation processes of the interface pin in FIG. 11.

DETAILED DESCRIPTION OF THE EXAMPLE EMBODIMENTS

Hereinafter, exemplary embodiments of the present inventive concept will be described in detail with reference to the accompanying drawings.

Figure 1:
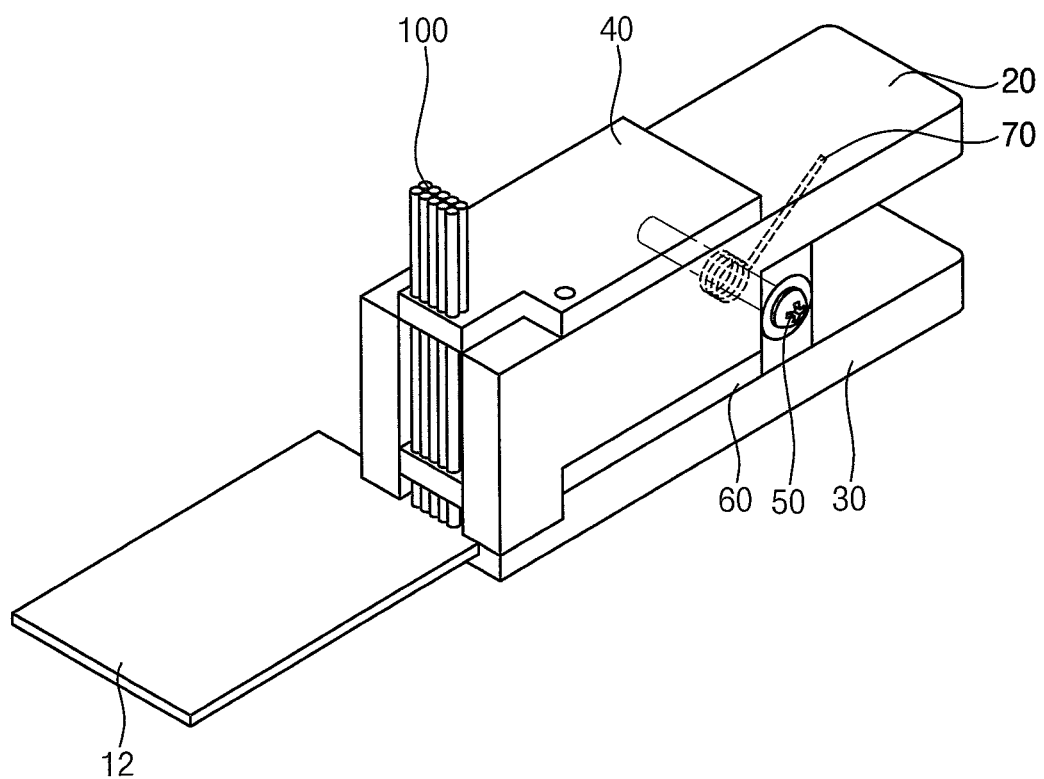
FIG. 1 is a perspective view illustrating a test socket according to an exemplary embodiment of the present inventive concept.
Figure 2:
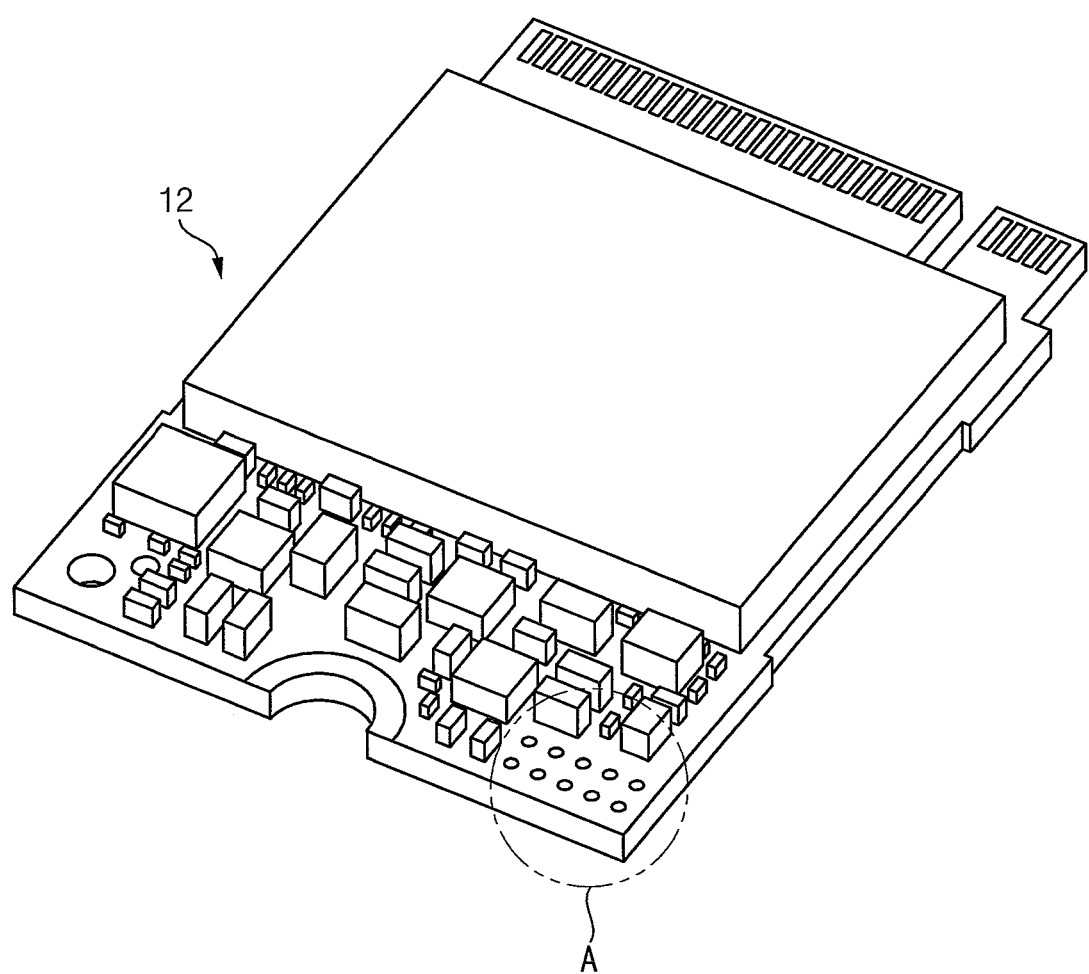
FIG. 2 is a perspective view illustrating a sample according to an exemplary embodiment of the present inventive concept.
Figure 3:
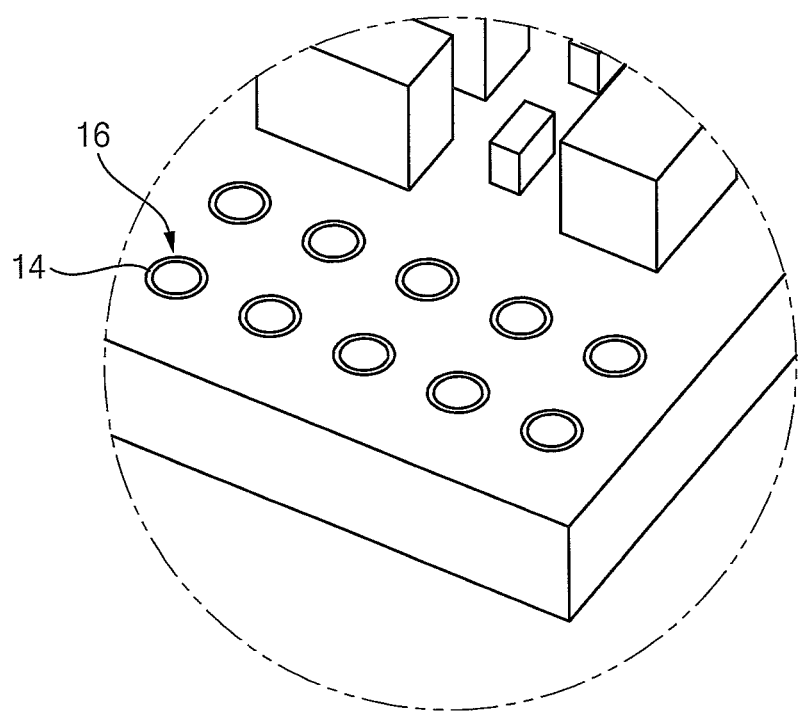
FIG. 3 is an enlarged perspective view illustrating portion 'A' in FIG. 2.

FIG. 1 is a perspective view illustrating a test socket according to an exemplary embodiment of the present inventive concept. FIG. 2 is a perspective view illustrating a sample according to an exemplary embodiment of the present inventive concept. FIG. 3 is an enlarged perspective view illustrating portion 'A' in FIG. 2.

Referring to FIGS. 1 to 3, a test socket 10 may include a first body 20, a second body 30, a test board 40 and a plurality of interface pins 100. The test socket 10 may further include a plate 60. The test socket 10 may further include an elastic body 70. The test socket 10 may be referred to as a device for performing a reliability test on a sample 12 including, for example, a semiconductor device, a storage device, and the like.

The test socket 10 may be electrically connected to the sample 12 that is to be tested so that the reliability test may be performed on the sample 12. The interface pins 100 may contact the sample 12 to be electrically connected to a plurality of test terminals 14 provided in the sample 12 such that the test socket 10 performs the test on the sample 12. For example, the sample 12 may include a solid state drive (SSD). The SSD may be a storage medium including a NAND flash memory and a controller configured to control the same, and may be a storage device having relatively high read and write speeds and a relatively low power consumption. The SSD may include various types such as 2.5" (U.2, U.3), EDSFF, and M.2.

As illustrated in FIGS. 2 and 3, the sample 12 may include a circuit board, on which the plurality of test terminals 14 is provided, that is to be electrically connected to the test socket 10. For example, the test terminals 14 may be provided on an inner surface of a via hole 16 which penetrates the circuit board. In addition, the test terminals 14 may be provided to be inserted into the via hole 15 to at least partially fill up the via hole 16. The test terminals 14 may include conductive materials. The test terminals 14 may be connected to circuit wires provided in the sample 12.

The interface pins 100, which are to be described later, of the test socket 1 may contact the test terminals 14, and the test socket 10 may perform the test on the sample 12 using the test board 40. The test socket 10 may be designed in various ways according to e type of the sample 12 to be tested.

Figure 4:
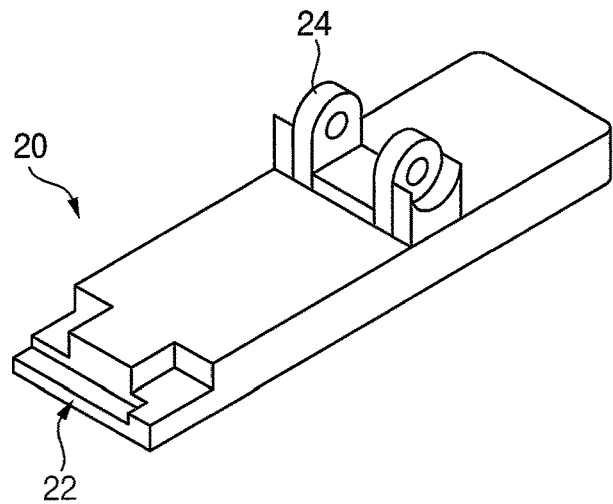
FIG. 4 is a perspective view illustrating a first body according to an exemplary embodiment of the present inventive concept.
Figure 5:
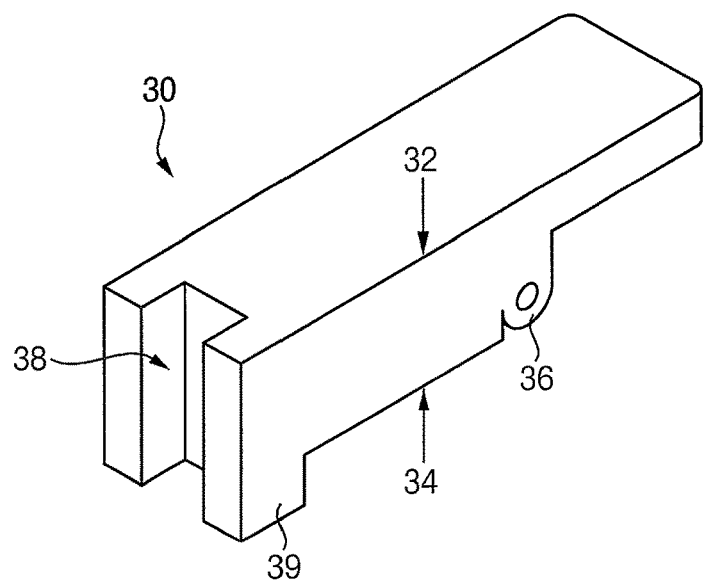
FIG. 5 is a perspective view illustrating a second body according to an exemplary embodiment of the present inventive concept.
Figure 6:
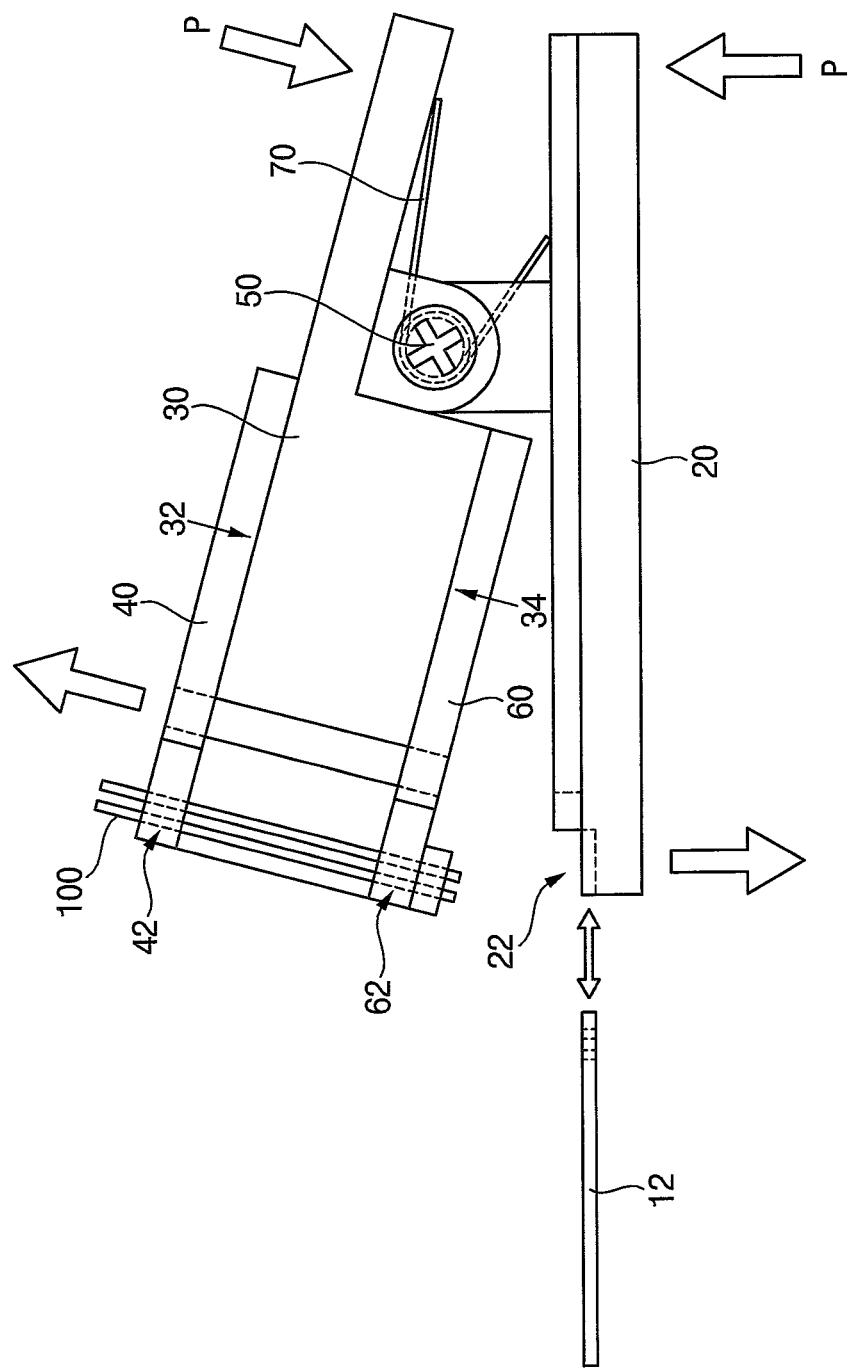
FIGS. 6, 7 and 8 are front views illustrating operation processes of the test socket in FIG. 1.
Figure 7:
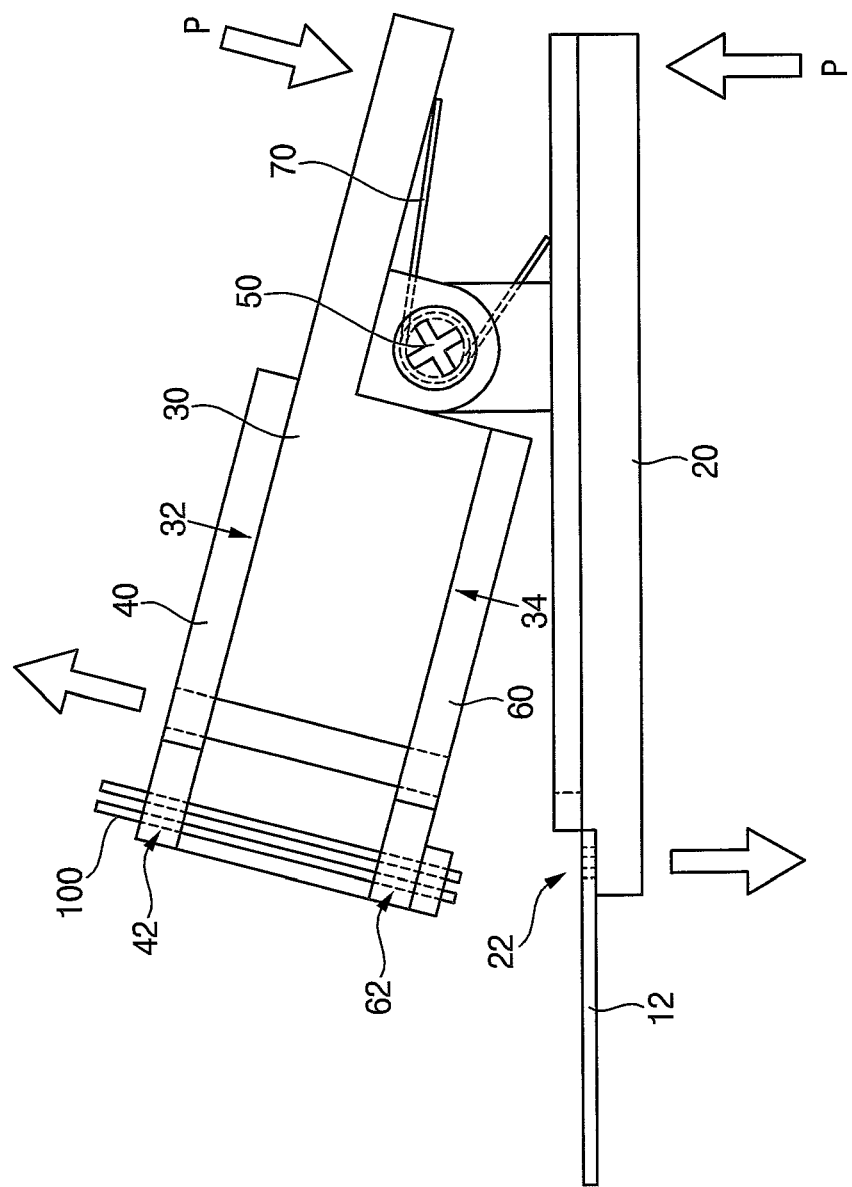
Figure 8:
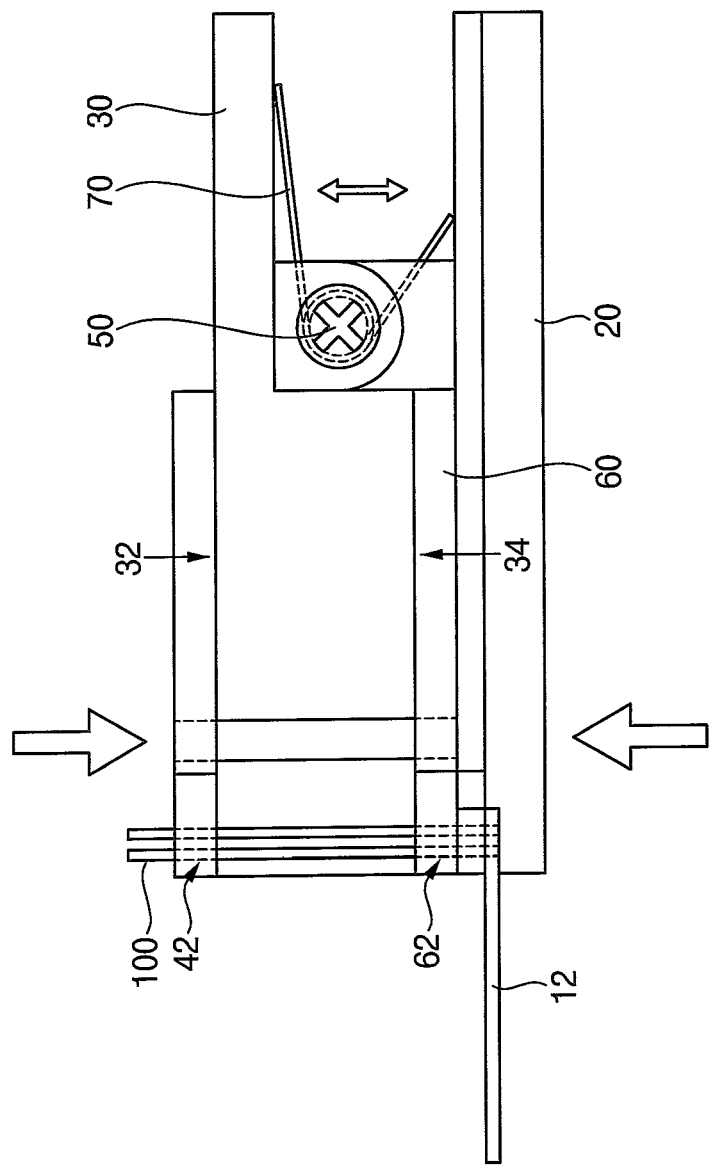
Figure 9:
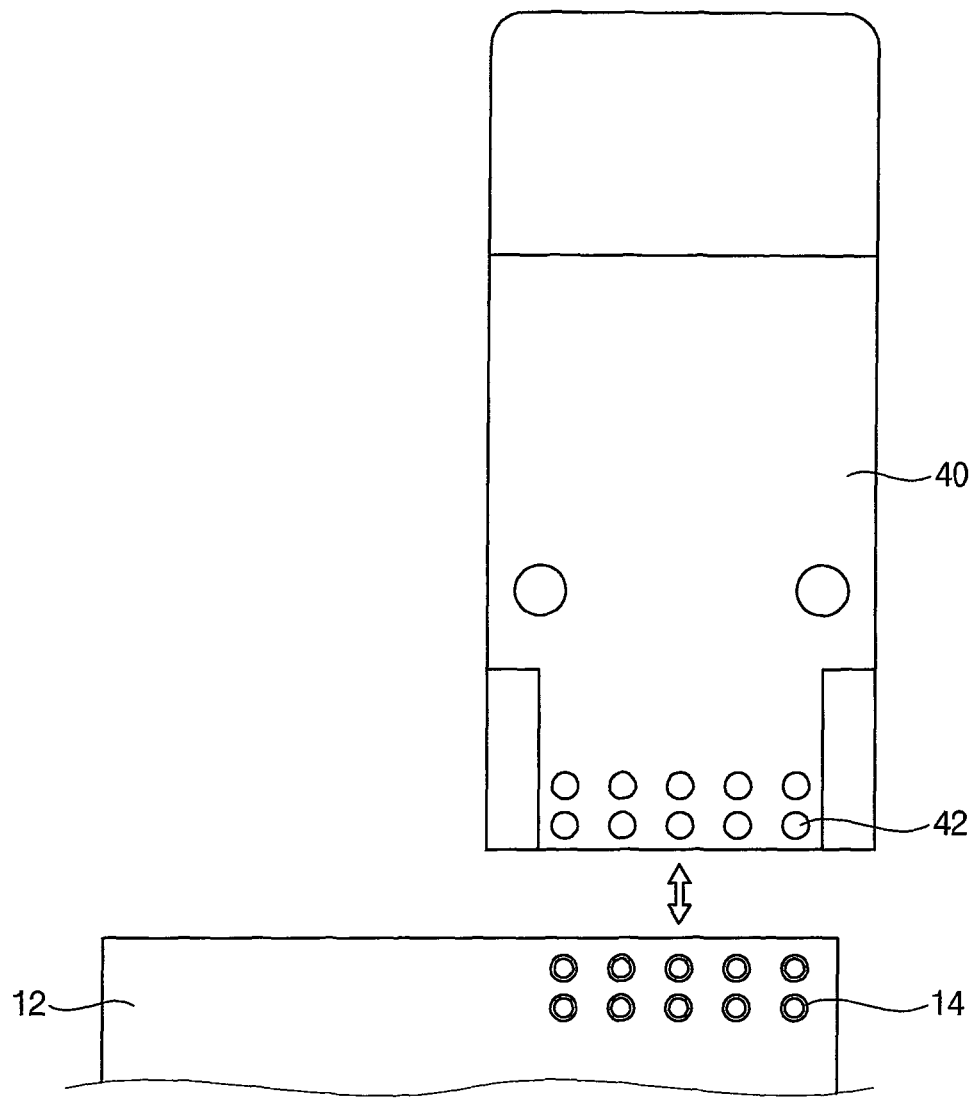
FIGS. 9 and 10 are cross-sectional views illustrating arrangements of terminals of the sample and first openings of the test board.
Figure 10:
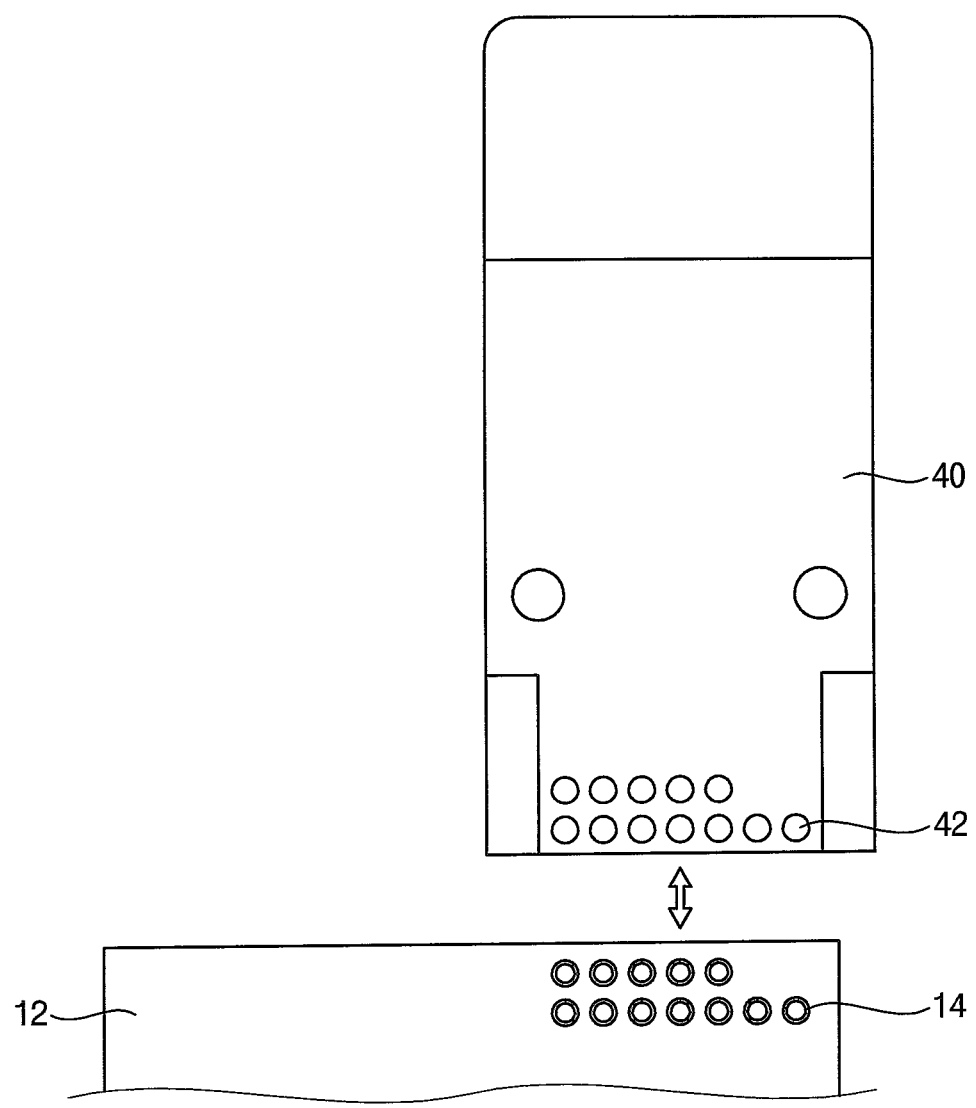

FIG. 4 is a perspective view illustrating a first body according to an exemplary embodiment of the present inventive concept. FIG. 5 is a perspective view illustrating a second body according to an exemplary embodiment of the present inventive concept. FIGS. 6 to 8 are front views illustrating operation processes of the test socket of FIG. 1. FIGS. 9 and 10 are cross-sectional views illustrating arrangements of terminals of the sample and first openings of the test board.

Referring to FIGS. 4 to 10, the first body 20 may have a plate shape, and the sample 12 to be tested may be disposed on the first body 20. For example, the first body 20 may include a synthetic resin material having excellent insulation properties.

The first body 20 may include a first shaft fixing portion 24. The first body 20 may be interlocked with the second body 30 by a hinge pin 50 passing through the first shaft fixing portion 24 such that the second body 30 rotates relative to the first body 20 about the hinge pin 50 as a fixed axis of rotation. The hinge pin 50 may be inserted into a hollow portion (e.g., a hole) of the first shaft fixing portion 24 such that the first body 20 and the second body 30 are interlocked with each other on one axis. Accordingly, the first body 20 may be connected to the second body 30, which is to be described later, by the hinge pin to rotate relative to the second body 30 about one axis. Accordingly, to perform the test, an operator or a robot may apply pressure P to an end portion of the first body 20 and/or the second body 30 to bring the first body 20 and the second body 30 into contact with each other or to separate the first body 20 from the second body 30.

The first body 20 may include a fixing portion 22. For performing the test, the sample 12 may be mounted on the fixing portion 22. The fixing portion 22 may have a shape corresponding to at least one of corners of the sample 12, and thus the sample 12 may be mounted stably on the fixing portion 22. For example, the fixing portion 22 may be an indentation in the first body 20, and may have an open side and a closed side that corresponds to a corner of the sample 12. Accordingly, the fixing portion 22 may have various shapes depending on the type of the sample 12 to be tested.

In case that the second body 30 rotates relative to the first body 20 about the hinge pin 50 as the fixed axis of rotation, the sample 12 may be mounted at a predetermined position on the fixing portion 22 such that the interface pins 100 are in contact with the test terminals 14 provided M the sample 12. For example, the fixing portion 22 may have the same shape as the corner portion of the sample 12 where the test terminals 14 are located, and thus, the sample 12 may be mounted on the fixing portion 22 so that the interface pins 100 stably contact the test terminals 14, respectively.

In an exemplary embodiment of the present inventive concept, the second body 30 may have a plate shape and may hold the sample 12 on which the test is being performed. For example, the second body 30 may include a synthetic resin material having excellent insulation properties.

The second body 30 may be disposed to face the first body 20 during the test process. The second body 30 may be disposed to be partially spaced apart from the first body 20 to provide a space for mounting and detaching the test sample 12 to the first body 20. For example, the fixing portion 22 of the first body 20 may be spaced apart from the second body 30 so that the test sample 12 can be mounted to and detached from the first body 20.

The second body 30 may include a first surface 32 and a second surface 34 opposite to each other. The second body 30 may be positioned such that the second surface 34 faces the first body 20. The test board 40 may be disposed on the first surface 32, and the plate 60 may be disposed on the second surface 34. The interface pins 100 may be provided to penetrate the test board 40, the second body 30 and the plate 60 and may be fixed to the test board 40, the second body 30 and the plate 60.

The second body 30 may include a second shaft fixing portion 36. The second body 30 may be interlocked with the first body 20 by the hinge pin 50 passing through the second shaft fixing portion 36 such that the second body 30 rotates relative to the first body 20 about the hinge pin 50 as the fixed axis of rotation. The hinge pin 50 may be inserted into a hollow portion of the second shaft fixing portion 36 such that the first body 20 and the second body 30 are interlocked with each another. Further, the hinge pin 50 may pass through the first shaft fixing portion 24 and the second shaft fixing portion 36 to interlock the second body 30 with the first body 20. Accordingly, to perform the test, the operator or robot may apply and remove the pressure P to the end portions of the first body 20 and the second body 30 such that the first body 20 and the second body 30 come into contact with or get farther away from each other.

When the second body 30 rotates relative to the first body 20 about the hinge pin 50 as the fixed axis of rotation such that the first body 20 and the second body 30 come into contact with each other, the sample 12 that is to be tested may be held between the first body 20 and the second body 30. When the second body 30 rotates relative to the first body 20 about the hinge pin 50 such that the first body 20 and the second body 30 get farther away from each other, the sample 12 that is to be tested may be removed from between the first body 20 and the second body 30.

The second body 30 may include a receiving portion 38 and a protruding portion 39. The receiving portion 38 receives the interface pins 100, and the protruding portion 39 may apply pressure to the sample 12. The receiving portion 38 may be provided to be depressed or indented in one side of the second body 30. The protruding portion 39 may be provided in both sides of the receiving portion 38, and the protruding portion 39 may protrude from the second surface 34 to apply a downward pressure to the sample 12.

The receiving portion 38 and the protruding portion 39 may be provided at positions corresponding to the fixing portion 22 of the first body 20. Accordingly, the interface pins 100 received in the receiving portion 38 may come into contact with the test terminals 14 of the sample 12, and the protruding portion 39 provided in both sides of the receiving portion 38 may hold the sample 12 together with the fixing portion 22 in a vertical direction. For example, the protruding portion 39 will press the sample 12 against the fixing portion 22 to hold the sample 12 in place.

The second body 30 may be moved in an axial direction of the hinge pin 50 on the first body 20. The position of the second body 30 may be adjusted such that the interface pins 100 are provided on the test terminal 14 of the sample 12 mounted on the first body 20. Accordingly, the test socket 10 may adjust the position of the second body 30 according to the positions of the test terminals 14 on the sample 12, and the test socket 10 may perform the test on various types of samples 12.

In an exemplary embodiment of the present inventive concept, the test board 40 may include a circuit for testing the sample 12 and a plurality of first openings 42 for electrical connection with the circuit. The first openings 42 may be provided to penetrate the test board 40 in a thickness direction of the test board 40. For example, the test board 40 may be connected to an external device to receive power and exchange data. The test board 40 may be referred to as an electronic board for testing reliability of the sample 12.

The test board 40 may vary depending on the test contents and the types of the sample 12. For example, the test board 40 may include a T32 connector for performing the test on the SSD. The test board 40 may include a JTAG connector for electrical connection with the SSD to proceed with the test. The test board 40 may include the T32 connector and the JTAG connector in one board, and a signal length between the T32 connector and the JTAG connector may be reduced to thereby prevent deterioration of signal characteristics that may occur during the test.

The interface pins 100 may be disposed in the first openings 42. The first openings 42 may be provided at different positions depending on the type of the sample 12 that is to be tested. The first openings 42 may be provided at positions corresponding to the positions of the test terminals 14 provided on the sample 12. The first openings 42 may be electrically connected to the circuit. Thus, the circuit may exchange an electrical signal with the sample 12 through the interface pins 100 and the first openings 42.

When the first body 20 and the second body 30 rotate relative to each other about the hinge pin 50, which is the fixed axis, to come into contact with each other, the first openings 42 may be located on the same axis as second openings 62, which is provided on the plate 60, and the test terminal 14, which is provided on the sample 12, to be described later. For example, the first opening 42, the second opening 62 and the test terminal 14 may be aligned with each other. In addition, when the second body 30 rotates relative to the first body 20 about the hinge pin 50, which is the fixed axis of rotation, such that first body 20 and the second body 30 become far away from each other, the first openings 42 may be located on the same axis as the second openings 62, for example, the first opening 42 and the second opening 62 may be aligned with each other. Accordingly, the interface pins 100 may be fixed in the first openings 42 and the second openings 62, and the interface pins 100 may come into contact with or may be spaced from the test terminal 14 according to the rotation of the second body 30 relative to the first body 20.

The elastic body 70 may be provided between the first body 20 and the second body 30 to provide a restoring force (e.g., a force opposing the pressure P applied to the first body 20 and the second body 30). For example, the elastic body 70 may be a metal rod or coil wrapped around or bent around the hinge pin 50, and may include a first portion, which extends beyond the hinge pin 50 and contacts the first body 20, and a second portion, which extends beyond the hinge pin 50 and contacts the second body 30. For example, the elastic body 70 may provide the restoring force between the first body 20 and the second body 30 so as to apply pressure to the interface pins 100 toward the sample 12 fixed to the fixing portion 22. By using the restoring force, the interface pins 100 may automatically contact the test terminals 14 provided on the sample 12 mounted on the fixing portion 22. Accordingly, when the operator or robot releases the first body 20 and the second body 30 after mounting the sample 12 on the fixing portion 22, the interface pins 100 and the test terminals 14 may come into contact with each other due to the restorative force provided from the elastic body 74, and then, the test may proceed.

In an exemplary embodiment of the present inventive concept, the plate 60 may be in contact with the second surface 34 of the second body 30. The plate 60 may be coupled to the second body 30 and may move with the second body 30. The plate 60 may include a plurality of the second openings 62. The second openings 62 may be provided to penetrate the plate 60 in a thickness direction of the plate 60.

The interface pins 100 may be fixedly provided in the plate 60 such that an axial change with respect to the interface pins 100 might not occur. The second openings 62 of the plate 60 and the first openings 42 of the test board 40 may be aligned on the same axis. The interface pins 100 may be inserted and held in the first openings 42 and the second openings 62. Upper portions of the interface pins 100 may be fixedly provided in the first openings 42, and lower portions of the interface pins 100 may be fixedly provided in the second openings 62, and thus, stability may be increased compared to a case in which the interface pins 100 are supported to be held only by the first openings 42 of the test board 40.

In an exemplary embodiment of the present inventive concept, when the second body 30 rotates about the hinge pin 50, the interface pins 100 may come into contact with the test terminals 14 at substantially the same time. For example, since the first body 20 and the second body 30 rotate relative to each other about the hinge pin 50, which acts as the fixed axis of rotation, to come into contact with each other in the form of a tongs structure, the interface pins 100 may come into contact with the test terminals 14 provided in the sample 12 at substantially the same time.

Accordingly, a short circuit that may occur when the sample 12 and the interface pins 100 are electrically connected to each other may be prevented, and an internal reset phenomenon of the sample 12 caused by the short circuit may be prevented.

As illustrated in FIGS. 9 and 10, the number of the first openings 42 may be within a range of 10 to 12 according to the type of the sample 12. For example, the first openings 42 may be arranged in two rows; however, the present inventive concept is not limited thereto. For example, when the sample 12, which is to be tested, is either 10-pin or 12-pin, the first openings 42 may be positioned corresponding to the test terminals 14 provided in the sample 12.

FIG. 11 is a cross-sectional view illustrating an end portion of an interface pin according to an exemplary embodiment of the present inventive concept. FIGS. 12 to 15 are cross-sectional views illustrating operation processes of the interface pin of FIG. 11.

Referring to FIGS. 11 to 15, the interface pin 100 may include a cylindrical body 130, a contact pin 110, and a spring 120. The cylindrical body 130 is inserted into the first opening 42 and is fixedly provided in the first opening 42, and the cylindrical body 130 has an open end portion. The contact pin 110 is provided in the open end portion of the body 130, and the spring 120 presses the contact pin toward the open end portion of the cylindrical body 130. The interface pins 100 may electrically connect the test terminal 14 provided in the sample 12 and the test board 40 to each other to perform the test on the sample 12. For example, the interface pin 100 may include a pogo pin.

A driving signal and a test signal may be transmitted through the interface pins 100 between the test sample 12 and the test board 40. The driving signal and test signal provided to the interface pin 100 may be provided to the contact pin 110 through the body 130, and then, the driving signal and the test signal provided to the contact pin 110 may be provided to the test terminal 14 of the sample 12 to perform an electrical test on the sample 12. In addition, the driving signal and the test signal provided to the interface pin 100 may be provided to the body 130 through the contact pin 110, and then, the driving signal and the test signal provided to the body 130 may be applied to the circuit of the test board 40 to perform the electrical test on the sample 12.

For example, the number of the interface pins 100 may be within a range of 10 to 12. The interface pins 100 may be fixedly provided to respectively penetrate through the first openings 42 that are arranged in two rows. When the sample 12 that is to be tested is either 10-pin or 12-pin, the interface pins 100 may be fixedly provided to penetrate through the first openings 42 corresponding to the positions of the test terminals 14 provided in the sample 12.

The interface pin 100 may be formed to have a length longer than a height (e.g., thickness) of the second body 30. A first end portion of the interface pin 100 and a second end portion opposite to the first end portion may protrude beyond the first surface 32 of the second body 30 and the second surface 34 opposite to the first surface 32, respectively.

For example, the body 130 may have a cylindrical shape with a cavity. The body 130 may have a shape in which the end portion is open. The contact pin 110 may be provided in the open end portion of the body 130, and the spring 120 may be provided in the cavity of the body 130 to press the contact pin 110 to the open end portion.

The body 130 may include a protrusion that protrudes from an inner surface of the open end portion of the cylindrical shaped cavity. Accordingly, a movement in an outward direction of the contact pin 110 may be limited by the protrusion of the body 130, and thus, the contact pin 110 may move inside the body 130, but the contact pin 110 may be prevented from breaking away from the body 130. The protrusion in the inner surface of the body 130 may serve as a clasp for preventing the contact pin 110 from escaping from a predetermined space in the body 130.

The body 130 may include, for example, copper (Cu), aluminum (Al), tungsten, nickel (Ni), molybdenum (Mo), gold (Au), silver (Ag), chromium (Cr), tin (Sn), titanium (Ti), or a combination thereof. Accordingly, the body 130 including a conductor may electrically connect the test board 40 and the sample 12 to each other.

The contact pin 110 may protrude from the open end portion of the body 130 to contact the test terminal 14 provided in the sample 12. The contact pin 110 may come into contact with the test terminal 14 to electrically connect the sample 12 and the test hoard 40 to each other. The contact pin 110 may include a conductive anti-wear material to be prevented from being worn by repetitive operations.

The contact pin 110 may be pressed from the open side to the outside of the body 130 by the elastic force of the spring 120. When an external impact is applied on the contact pin 110, the contact pin 110 may move to the inside of the body 130, and the impact may be alleviated by the spring 120. Accordingly, the con tact pin 110 may alleviate the impact applied to the test terminal 14 while the test is in progress. For example, when the contact pin 110 is pressed against the test terminal 14, the contact pin 110 may move inside the body 130. The contact pins 110 may alleviate the impact applied to the test board 40.

The contact pin 110 may have a structure protruding from the open end portion of the body 130, and the contact pin 110 may have a convex structure having a narrower distal end. For example, the distal end of the contact pin 110 may be narrower than an upper portion (e.g., a central portion) of the contact pin 110, and the distal end of the contact pin 110 may have a convex shape. When the contact pin 110 comes into contact with the test terminal 14, narrow distal end of the contact pin 110 may come into act with a relatively small area of the test terminal 14 first, and then the contact pin 110 may come into contact with a relatively large area of the test terminal 14. Accordingly, bending, misalignment, or damage to the contact pin 110 or the test terminal 14 may be prevented. Thus, even though the contact pin 110 is slightly misaligned with the test terminals 14, it may be possible to perform the test.

The contact pin 110 may include, for example, copper (Cu), aluminum (Al), tungsten, nickel (Ni), molybdenum (Mo), gold (Au), silver (Ag), chromium (Cr), tin (Sn), titanium (Ti) and a combination thereof. Accordingly, the contact pin 110 including a conductor may electrically connect the test board 40 and the sample 12 to each other.

Figure 13:
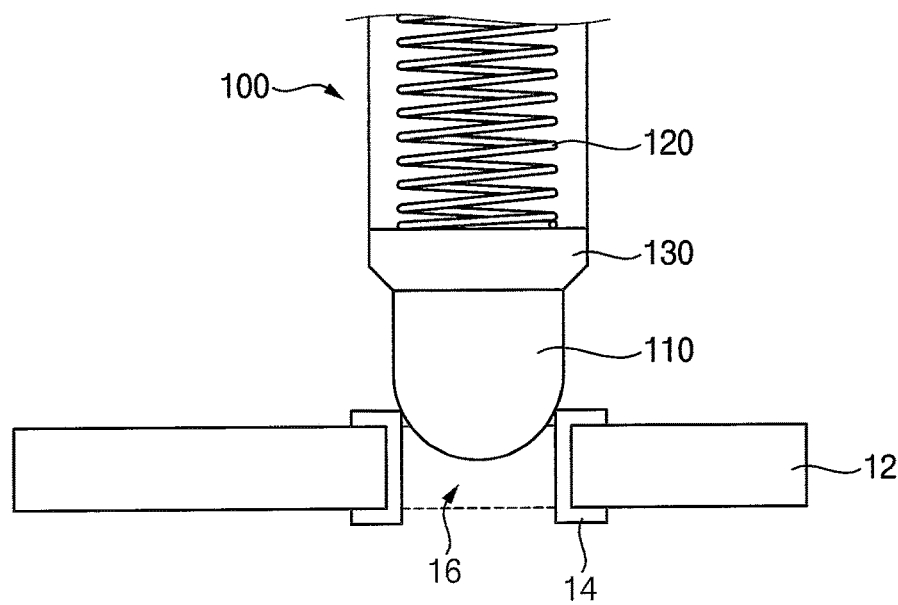

As illustrated in FIGS. 12 and 13, the interface pin 100 may be moved in the vertical direction according to the rotation of the second body 30 relative to the first body 20, and the contact pin 110 may come into contact with the test terminal 14 provided in the form of an opening in the sample 12.

For example, the test terminal 14 may be provided to surround the inner surface of the via hole 16 which penetrates the sample 12 and may have first diameter D1. The contact pin 110 may have a second diameter D2 greater than the first diameter D1 and may have a convex shape. Accordingly, when the interface pin 100 descends in the vertical direction, a portion of the contact pin 110 may be inserted into the via hole 16, and a portion of the contact pin 110 may come into contact with the test terminal 14. Even though the contact pin 110 is in contact with the test terminal 14, the second body 30 may further rotate relative to the first body 20, and thus, as an additional force is applied to the contact pin 110, the contact pin 110 may be moved into the body 130. When the contact pin 110 moves into the body 130, the spring 120 may absorb the force applied to the contact pin 110. For example, the first diameter D1 may be within a range of about 0.35 mm to about 0.55 mm. For example, the second diameter D2 may be within a range of about 0.3 mm to about 0.6 mm.

Figure 14:
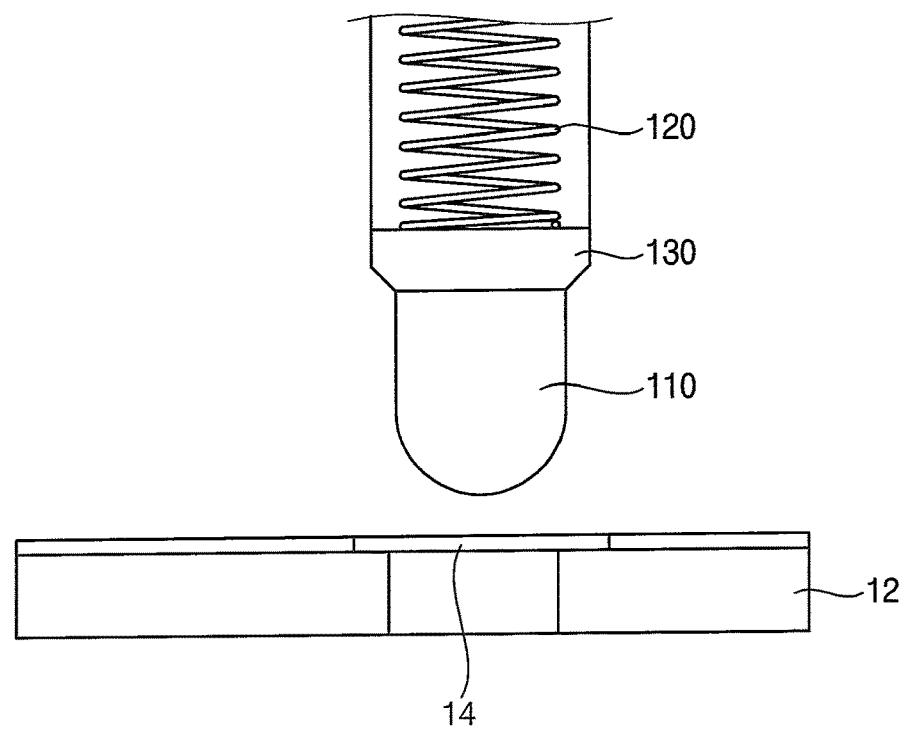
Figure 15:
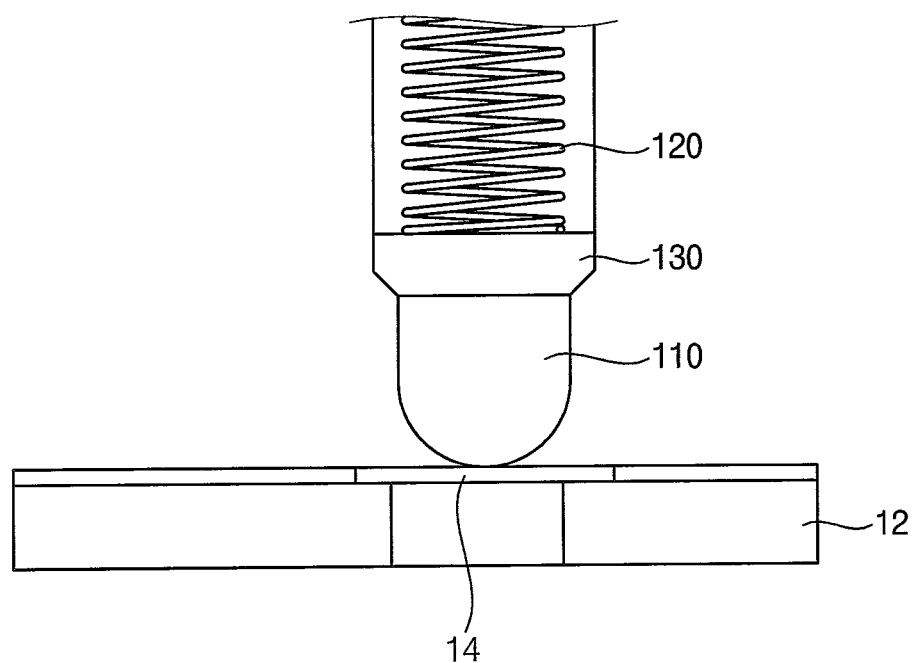

As illustrated in FIGS. 14 and 15, the interface pin 100 may absorb the shock regardless of the type of the test terminal 14. For example, the interface pin 100 may be moved in the vertical direction according to the rotation of the second body 30 relative to the first body 20, and the contact pin 110 may come into contact with the test terminal 14 provided in a planar shape on the sample 12.

When the interface pin 100 descends in the vertical direction, a portion of the contact pin 110 may come into contact with the test terminal 14. Even though the contact pin 110 is in contact with the test terminal 14, the second body 30 may further rotate relative to the first body 20, and thus, as an additional force is applied to the contact pin 110, the contact pin 110 may be moved into the body 130. When the contact pin 110 moves into the body 130, the spring 120 may absorb the force applied to the contact pin 110.

As described above, the test socket 10 may include the fixing portion 22 of the first body 20 configured to receive the sample 12, which is to be tested, in a desired test position. Further, since the spring 120 absorbs the force when the contact pin 110 comes into contact with the test terminal 14 provided in the sample 12, the impact on the test terminal 14 may be absorbed or alleviated. Furthermore, since the second body 10 rotates relative to the first body 20 about the hinge pin 50, the interface pins 100 may come into contact with the test terminals 14 at substantially the same time, and thus, the occurrence of the short circuit of the sample 12 may be prevented.

It will be understood that in some instances, as would-be apparent to one of ordinary skill in the art, features, characteristics, and/or elements described in connection with a particular exemplary embodiment of the present inventive concept may be used singly or in combination with features, characteristics, and/or elements described in connection with other exemplary embodiments of the present inventive concept unless otherwise specifically indicated.

While the present inventive concept has been described with reference to example embodiments thereof, it will be understood by those of ordinary skill in the art that various changes in form and details may be made thereto without departing from the spirit and scope of the present inventive concept.

What is claimed is:

1. A test socket, comprising:
a first body including a fixing portion configured to receive a sample having a plurality of test terminals;
a second body facing the first body and coupled with the first body such that the second body rotates relative to the first body about a hinge pin;
a test board provided on the second body and configured to test the sample, wherein the test board has a plurality of first openings provided therein; and
a plurality of interface pins penetrating through the first openings, wherein each of the plurality of interface pins includes a contact pin and a spring, wherein the contact pin is provided in a first end portion of each of the plurality of interface pin and is configured to come into contact with a test terminal of the plurality of test terminals, and the spring elastically supports the contact pin,
wherein the plurality of interface pins extend through the second body and is exposed by the second body.

2. The test socket of claim 1, wherein the fixing portion receives the sample at a preset position to be mounted thereon such that the contact pins come into contact with the plurality of test terminals when the second body rotates about the hinge pin.

3. The test socket of claim 1, wherein the second body and a second surface opposite to the first surface,
wherein the test board is disposed on the first surface,
wherein the test socket further comprises: a plate disposed on the second surface,
wherein the plate has second openings for fixing the plurality of interface pins, and wherein the second openings are arranged to correspond to the first openings.

4. The test socket of claim 1, wherein the plurality of interface pins come into contact with the plurality of test terminals at the same time when the second body rotates about the hinge pin.

5. The test socket of claim 1, wherein each of the plurality of test terminals is provided on an inner surface of a corresponding via hole, which penetrates the sample and has a first diameter,
wherein the contact pin of each of the interface pins has a second diameter greater than the first diameter,
wherein the contact pin has a convex structure having a distal end narrower than an upper portion of the contact pin, and wherein at least a portion of the distal end of the contact pin comes into contact with the test terminal.

6. The test socket of claim 5, wherein the second diameter is within a range of about 0.3 mm to about 0.6 mm.

7. The test socket of claim 1, wherein the number of the plurality of interface pins is within a range of 10 to 12, and the plurality of interface pins penetrate through the first openings that are arranged in two rows.

8. The test socket of claim 1, wherein the plurality of interface pins include at least one of copper, aluminum, tungsten, nickel, molybdenum, gold, silver, chromium, tin or titanium.

9. The test socket of claim 1, further comprising:
an elastic body configured to provide a restoring force between the first and second bodies to bring the interface pins toward the sample mounted on the fixing portion.

10. The test socket of claim 1, wherein the sample includes a solid state drive (SSD), and
wherein the plurality of interface pins are provided in the same arrangement as that of the plurality of test terminals provided in the SSD.

11. A test socket, comprising:
a first body including a fixing portion configured to receive a sample having a plurality of test terminals;
a second body facing the first body and coupled with the first body such that the second body rotates relative to the first body about a hinge pin;
a test board disposed on the second body and configured to test the sample;
a plurality of interface pins provided in the test board to extend toward the first body in a preset arrangement, wherein each of the plurality of interface pins has a cylindrical body, a contact pin, and a spring, wherein the cylindrical body has an open end portion, wherein the contact pin is provided in the open end portion of the cylindrical body and comes into contact with a test terminal of the plurality test terminals, and the spring applies an elastic force to the contact pin toward the open end portion of the cylindrical body; and an elastic body configured to provide a restoring force between the first and second, bodies to bring the plurality of interface pins toward the sample mounted on the fixing portion, wherein each of the plurality of test terminals is provided on an inner surface of a corresponding via hole, which penetrates the sample and has a first diameter, and the contact pin of each of the plurality of interface pins has a second diameter greater than the first diameter, wherein the contact pin has a convex structure having a distal end narrower than a first portion of the contact pin, and at least a portion of the distal end of the contact pin comes into contact with the test terminal.

12. The test socket of claim 11, wherein the fixing portion receives the sample at a preset position to be mounted thereon such that the contact pins come into contact with the plurality of test terminals when the second body rotates about the hinge pin.

13. The test socket of claim 11, wherein the second body has a first surface and a second surface opposite to the first surface, and wherein the test board contacts the first surface, wherein the test socket further comprises: a plate contacting the second surface, wherein the plate has a plurality of openings provided in the same arrangement as that of the plurality of interface pins such that the plurality of interface pins are inserted into and supported in the plurality of openings of the plate.

14. The test socket of claim 11, wherein the plurality of interface pins come into contact with the test terminals at the same time when the second body rotates about the hinge pin.

15. The test socket of claim 11, wherein the second diameter is within a range of about 0.3 mm to about 0.6 mm.

16. The test socket of claim 11, wherein the number of the plurality of interface pins is within a range of 10 to 12, and the plurality of interface pins are arranged in two rows.

17. The test socket of claim 11, wherein the plurality of interface pins include at least one of copper, aluminum, tungsten, nickel, molybdenum, gold, silver, chromium, tin or titanium.

18. The test socket of claim 11, wherein the sample includes a solid state drive (SSD), and the plurality of interface pins are provided in the same arrangement as that of the plurality of test terminals provided in the SSD.

19. A test socket, comprising:

a first body including a fixing portion configured to receive a sample having a plurality of test terminals;

a second body coupled with the first body to rotate relative to the first body by a hinge pin;

a test board provided on the second body and configured to test the sample, wherein the test board has a plurality of first openings provided therein;

a plurality of interface pins penetrating through the first openings, wherein each of the plurality of interface pins includes a contact pin and a spring, wherein the contact pin is provided in a first end portion of each of the plurality of interface pin and is configured to come into contact with a test terminal of the plurality of test terminals, and wherein the spring elastically presses the contact pin toward the sample and is configured to absorb shock; and an elastic body configured to provide a restoring force between the first and second bodies and to bring the plurality of interface pins toward the sample mounted on the fixing portion, wherein the elastic body is disposed between the first body and the second body, wherein the fixing portion receives the sample at a preset position to be mounted thereon such that the contact pins of the plurality of interface pins come into contact with the plurality of test terminals when the second body rotates about the hinge pin due to the restoring force provided by the elastic body.

* * * * *